(12) United States Patent
Wu et al.

(10) Patent No.: US 11,294,115 B1
(45) Date of Patent: Apr. 5, 2022

(54) ENHANCED LIGHT DIFFUSION FILM STRUCTURE

(71) Applicant: Wah Hong Industrial Corp., Kaohsiung (TW)

(72) Inventors: Chih-Chen Wu, Kaohsiung (TW); I-Feng Lin, Kaohsiung (TW); Ching-Wen Yu, Kaohsiung (TW)

(73) Assignee: WAH HONG INDUSTRIAL CORP., Kaohsiung (TW)

( * ) Notice: Subject to any disclaimer, the term of this patent is extended or adjusted under 35 U.S.C. 154(b) by 0 days.

(21) Appl. No.: 16/779,745

(22) Filed: Feb. 3, 2020

(51) Int. Cl.
*F21V 8/00* (2006.01)

(52) U.S. Cl.
CPC ......... *G02B 6/0051* (2013.01); *G02B 6/0065* (2013.01); *G02B 6/0068* (2013.01)

(58) Field of Classification Search
CPC ... G02B 6/0051; G02B 6/0068; G02B 6/0065
See application file for complete search history.

(56) References Cited

U.S. PATENT DOCUMENTS

| | | | |
|---|---|---|---|
| 2012/0113672 A1* | 5/2012 | Dubrow | G02B 6/0068 362/602 |
| 2012/0138894 A1 | 6/2012 | Qian et al. | |
| 2013/0215645 A1 | 8/2013 | Jang et al. | |
| 2013/0335677 A1 | 12/2013 | You | |
| 2013/0345458 A1 | 12/2013 | Freeman et al. | |
| 2014/0056024 A1* | 2/2014 | Kim | B32B 5/16 362/608 |
| 2015/0021521 A1 | 1/2015 | Nick et al. | |
| 2015/0070932 A1* | 3/2015 | Kim | G02B 6/0023 362/610 |
| 2015/0204515 A1 | 7/2015 | Xu et al. | |
| 2015/0285444 A1* | 10/2015 | Choi | G02B 5/201 362/84 |
| 2016/0170127 A1* | 6/2016 | Kim | G02B 6/004 362/606 |
| 2018/0231693 A1* | 8/2018 | Murata | B32B 27/14 |
| 2019/0187338 A1* | 6/2019 | Ichiba | G02B 1/11 |
| 2019/0310409 A1* | 10/2019 | Lee | G02B 6/0065 |

* cited by examiner

*Primary Examiner* — Kevin Quarterman
(74) *Attorney, Agent, or Firm* — Che-Yang Chen; Law Office of Michael Chen

(57) ABSTRACT

An enhanced light diffusion film structure includes a first substrate, a second substrate, a first light guide diffusion layer and a second light guide diffusion layer. The first light guide diffusion layer includes a first light guide diffusion material having a first degree of light guide diffusion to guide and diffuse incident light exited by the first substrate to form first-stage guided and diffused light. The second light guide diffusion layer includes a second light guide diffusion material having a second degree of light guide diffusion to further guide and diffuse the first-stage guided and diffused light exited by the first light guide diffusion layer to form second-stage guided and diffused light. The first degree of light guide diffusion of the first light guide diffusion material is relatively higher or lower than the second degree of light guide diffusion of the second light guide diffusion material.

20 Claims, 8 Drawing Sheets

$C_6H_{16}O_3Si$ $C_9H_{17}O_3NSi$ $C_{13}H_{16}O_4$ $C_9H_{10}O_2$ $C_{10}H_{12}O_2$ $C_{12}H_{16}O_2$ $C_{11}H_{14}O_2$ $C_9H_{10}O$ $C_{12}H_{16}O_3$ $C_{12}H_{14}O_4$ $C_{10}H_{12}O_3$ $C_{10}H_{12}O_3$ $C_{18}H_{28}O_2$ $C_{11}H_{14}O_3$ $C_9H_{10}O$ $C_{11}H_{12}O_3$ $C_9H_9O_2F$ $C_{10}H_{12}O_2$ $C_{13}H_{14}O_2$ $C_{11}H_{14}O_3$ $C_9H_{10}O_2$ $C_{14}H_{16}O_3N_2$ $C_{12}H_{14}O_3$ $C_9H_9O_3N$ $C_{18}H_{18}O_3$ $C_{15}H_{13}O_2N$ $C_{13}H_{12}O_2$ $C_{19}H_{38}O_2$ $C_{11}H_{22}O_2$
or $C_{13}H_{26}O_2$ n = 10, 12

$C_{15}H_{30}O_2$
or $C_{17}H_{34}O_2$ $C_{12}H_8O_2F_{16}$ $C_8H_8O_2F_8$ $C_5H_6O_2F_4$ $C_{11}H_5OF_{17}$ $C_9H_5OF_{13}$ $C_{11}H_{14}O_4$ $C_{11}H_{13}O_3N$ $C_{12}H_{14}O_3$ $C_{13}H_{18}O_2$ $C_{13}H_{18}O_2$ $C_{14}H_{20}O_2$ $C_{11}H_{14}O_3$ $C_{12}H_{14}O_3$ $C_{13}H_{18}O_2$ $C_{13}H_{18}O_2$ $C_{10}H_9O_2F_3$ $C_{10}H_{10}O_4$ $C_{12}H_{14}O_2$ $C_{14}H_{18}O_2$ $C_{13}H_{16}O_4$ $C_{11}H_{14}O_2$ $C_{12}H_{16}O_2$

ENHANCED LIGHT DIFFUSION FILM STRUCTURE

BACKGROUND OF THE INVENTION

1. Field of the Invention

The present invention relates to an enhanced light diffusion film structure. Particularly, the present invention relates to the multi-layer enhanced light diffusion film structure having at least one light guide diffusion layer including a QD (quantum dot) material or phosphors. More particularly, the present invention relates to the multi-layer enhanced light diffusion film structure having the at least one light guide diffusion layer including light guide diffusion particles made of a QD (quantum dot) material or phosphors.

2. Description of the Related Art

US Patent Application Publication No. 2012/0138894, entitled "STABLE AND ALL SOLUTION PROCESSABLE QUANTUM DOT LIGHT-EMITTING DIODES," discloses quantum dot light emitting diodes (QD-LEDs) where the electron injection and transport layer comprises inorganic nanoparticles (I-NPs). The use of I-NPs results in an improved QD-LED over those having a conventional organic based electron injection and transport layer and does not require chemical reaction to form the inorganic layer. In one embodiment of the invention, the hole injection and transport layer can be metal oxide nanoparticles (MO-NPs) which allows the entire device to have the stability of an all inorganic system and permit formation of the QD-LED by a series of relatively inexpensive steps involving deposition of suspensions of nanoparticles and removing the suspending vehicle.

Further, US Patent Application Publication No. 2015/0021521, entitled "QUANTUM DOT-CONTAINING COMPOSITIONS INCLUDING AN EMISSION STABILIZER, PRODUCTS INCLUDING SAME, AND METHOD," discloses a composition including quantum dots and an emission stabilizer, products including same, and methods, including methods for improving, or enhancing the emission stability of quantum dots. Inclusion of an emission stabilizer in a composition can improve or enhance the stability of at least one emissive property of the quantum dots in the composition against degradation compared to a composition that is the same in all respects except that it does not include the emission stabilizer. Examples of such emissive properties include lumen output, lumen stability, color point (e.g., CIE x, CIE y) stability, wavelength stability, FWHM of the major peak emission, absorption, solid state EQE, and quantum dot emission efficiency.

Further, US Patent Application Publication No. 2015/0204515, entitled "HIGHLY STABLE QDS-COMPOSITES FOR SOLID STATE LIGHTING AND THE METHOD OF MAKING THEM THROUGH INITIATOR-FREE POLYMERIZATION," discloses a lighting device comprising a light source configured to generate light source light, and (ii) a light converter configured to convert at least part of the light source light into visible converter light. The light converter comprises a polymeric host material with light converter nanoparticles embedded in the polymeric host material. The polymeric host material is based on radical polymerizable monomers, and the polymeric host material contains equal to or less then 5 ppm radical initiator based material relative to the total weight of the polymeric host material.

Further, US Patent Application Publication No. 2013/0345458, entitled "SILICONE LIGANDS FOR STABILIZING QUANTUM DOT FILMS," discloses siloxane polymer ligands for binding to quantum dots. The polymers include a multiplicity of amine or carboxy binding ligands in combination with long-alkyl chains providing improved stability for the ligated quantum dots. The ligands and coated nanostructures of the present invention are useful for close packed nanostructure compositions, which can have improved quantum confinement and/or reduced cross-talk between nano structures.

Further, US Patent Application Publication No. 2013/0335677, entitled "QUANTUM DOT-ENHANCED DISPLAY HAVING DICHROIC FILTER," discloses a display device, including a light source emitting a blue light and a light emitting layer including a first group of red quantum dots and a second group of green quantum dots. The light emitting layer is configured to absorb a first portion of the blue light from the light source to emit red light and green light and to transmit a second portion of the blue light. The display device also includes a dichroic filter layer configured to reflect a portion of the transmitted second portion of the blue light such that the reflected portion of the blue light is recycled in the light emitting layer and to transmit a remaining portion of the transmitted second portion of the blue light to output a white light.

Further, US Patent Application Publication No. 2013/0215645, entitled "LIGHT GUIDE PLATE, BACKLIGHT UNIT INCLUDING THE SAME, DISPLAY APPARATUS, AND METHOD OF THE SAME," discloses a backlight unit or a display apparatus including a light guide plate, with the light guide plate including: a first body with a light entry surface through which light enters; a second body with a light exit surface through which the incident light exits; and a quantum dot layer disposed between the first body and the second body with a quantum dot which converts a wavelength of the light incident through the first body.

However, there is a need of improving the phosphor or QD (quantum dot) material added to the light diffusion film structure for enhancing luminant stability and thermal stability. The above-mentioned patent application publications are incorporated herein by reference for purposes including, but not limited to, indicating the background of the present invention and illustrating the situation of the art.

SUMMARY OF THE INVENTION

The primary objective of this invention is to provide an enhanced light diffusion film structure, including a first light guide diffusion layer and a second light guide diffusion layer containing a QD (quantum dot) material or phosphors. The first light guide diffusion layer has a first light guide diffusion material while the second light guide diffusion layer has a second light guide diffusion material. The first light guide diffusion layer includes a first dispersion carrier having a degree of diffusion different from that of a second dispersion carrier of the second light guide diffusion material. Advantageously, the enhanced light diffusion film structure of the present invention is successful in enhancing a high degree of luminous stability and thermal stability.

The enhanced light diffusion film structure in accordance with an aspect of the present invention includes:
  a first substrate having a first surface and a second surface;
  a first light guide diffusion layer having a first surface and a second surface and provided on the second surface of the first substrate, with the first light guide diffusion layer including a first light guide diffusion material, with the first light guide diffusion material having a first degree of light guide diffusion to guide and diffuse incident light exited by the second surface of the first substrate to form first-stage guided and diffused light;

a second substrate having a first surface and a second surface; and a second light guide diffusion layer having a first surface and a second surface and provided on the first surface of the second substrate, with the second light guide diffusion layer including a second light guide diffusion material, with the second light guide diffusion material having a second degree of light guide diffusion to further guide and diffuse the first-stage guided and diffused light exited by the second surface of the first light guide diffusion layer to form second-stage guided and diffused light;

wherein the first degree of light guide diffusion of the first light guide diffusion material of the first light guide diffusion layer is higher than the second degree of light guide diffusion of the second light guide diffusion material of the second light guide diffusion layer so as to enhance light diffusion effect and to reduce a total thickness of the first and second light guide diffusion layers.

The enhanced light diffusion film structure in accordance with another aspect of the present invention includes:

a first substrate having a first surface and a second surface;

a first light guide diffusion layer having a first surface and a second surface and provided on the second surface of the first substrate, with the first light guide diffusion layer including a first light guide diffusion material, with the first light guide diffusion material having a first degree of light guide diffusion to guide and diffuse incident light exited by the second surface of the first substrate to form first-stage guided and diffused light;

a second substrate having a first surface and a second surface; and a second light guide diffusion layer having a first surface and a second surface and provided on the first surface of the second substrate, with the second light guide diffusion layer including a second light guide diffusion material, with the second light guide diffusion material having a second degree of light guide diffusion to further guide and diffuse the first-stage guided and diffused light exited by the second surface of the first light guide diffusion layer to form second-stage guided and diffused light;

wherein the first degree of light guide diffusion of the first light guide diffusion material of the first light guide diffusion layer is lower than the second degree of light guide diffusion of the second light guide diffusion material of the second light guide diffusion layer so as to enhance light diffusion effect and to reduce a total thickness of the first and second light guide diffusion layers.

In a separate aspect of the present invention, the first light guide diffusion layer and the second light guide diffusion layer are combined to form a single light guide diffusion layer having a various degree of light guide diffusion to form two-stage guided and diffused light.

In a further separate aspect of the present invention, the first surface of the first substrate is provided with a light diffusion particle layer, including a plurality of light diffusion particles.

In yet a further separate aspect of the present invention, the first surface of the first substrate is provided with a light diffusion particle layer, including a plurality of light diffusion particles, with the light diffusion particle layer made of a third light guide diffusion material.

In yet a further separate aspect of the present invention, the first surface of the first substrate is provided with a light diffusion particle layer, including a plurality of light diffusion particles made of a fourth light guide diffusion material.

In yet a further separate aspect of the present invention, the first surface of the first substrate is provided with a light diffusion particle layer, including a plurality of light diffusion particles, with the light diffusion particle layer made of a third light guide diffusion material, with the a plurality of light diffusion particles made of a fourth light guide diffusion material.

In yet a further separate aspect of the present invention, a third degree of light guide diffusion of the third light guide diffusion material is lower than a fourth degree of light guide diffusion of the fourth light guide diffusion material.

In yet a further separate aspect of the present invention, a thin light guide diffusion layer is further provided between the first light guide diffusion layer and the second light guide diffusion layer to form multiple light guide diffusion layers having a various degree of light guide diffusion to form multi-stage guided and diffused light.

In yet a further separate aspect of the present invention, a protective layer is attached to the second surface of the second surface.

Another objective of this invention is to provide a phosphor stabilizer and manufacturing method thereof for the enhanced light diffusion film structure. In combination reaction, a trimethoxysilylpropyl-modified polyethylenimine material reacts with an epoxy material to form a reactant which further reacts with a phosphor to form a colloid phosphor. Advantageously, the phosphor stabilizer of the present invention is successful in enhancing a high degree of luminous stability and thermal stability.

The phosphor stabilizer in accordance with an aspect of the present invention includes:

a trimethoxysilylpropyl-modified polyethylenimine material provided with a first predetermined amount;

an epoxy material provided with a second predetermined amount; and a reactant formed from the trimethoxysilylpropyl-modified polyethylenimine material reacted with the epoxy material in combination reaction;

wherein the reactant is a dispersion carrier performed as a stabilizer or a binder for reacting with a phosphor or a QD material to form a colloid phosphor material for enhancing a degree of luminous stability and thermal stability.

The phosphorescent material in accordance with an aspect of the present invention includes:

a phosphor or a QD material provided with a first predetermined amount;

a dispersion carrier provided with a second predetermined amount; and a colloid phosphor material formed from the a first predetermined amount of the phosphor or the QD material reacted with the second predetermined amount of the dispersion carrier in a first combination reaction;

wherein in a second combination reaction the dispersion carrier is formed from a trimethoxysilylpropyl-modified polyethylenimine material reacted with an epoxy material in combination reaction.

In a separate aspect of the present invention, the trimethoxysilylpropyl-modified polyethylenimine material having a functional group for modifying and bonding polyethylenimine is a free radical of a trimethoxysilylpropyl material.

In a further separate aspect of the present invention, the trimethoxysilylpropyl material is $C_6H_{15}O_3Si$ or $C_6H_{17}O_3NSi$.

In yet a further separate aspect of the present invention, the epoxy material is $C_{13}H_{16}O_4$, $C_9H_{10}O_2$, $C_{10}H_{12}O_2$, $C_{12}H_{16}O_2$, $C_{11}H_{14}O_2$, $C_9H_{10}O$, $C_{12}H_{16}O_3$, $C_{12}H_{14}O_4$, $C_{10}H_{12}O_3$, $C_{18}H_{28}O_2$, $C_{11}H_{14}O_3$, $C_9H_{10}O$, $C_{11}H_{12}O_3$, $C_9H_9O_2F$, $C_{10}H_{12}O_2$, $C_{15}H_{14}O_2$, $C_9H_{10}O_2$, $C_{14}H_{16}O_3N_2$, $C_{12}H_{14}O_3$, $C_9H_9O_3N$, $C_{18}H_{18}O_3$, $C_{15}H_{13}O_2N$, $C_{13}H_{12}O_2$, $C_{19}H_{38}O_2$, $C_{11}H_{22}O_2$, $C_{13}H_{26}O_2$, $C_{15}H_{30}O_2$, $C_{17}H_{34}O_2$, $C_{12}H_8O_2F_{16}$, $C_8H_8O_2F_8$, $C_5H_6O_2F_4$, $C_{11}H_5OF_{17}$, $C_9H_5OF_{13}$, $C_{11}H_{14}O_4$, $C_{11}H_{13}O_3N$, $C_{12}H_{14}O_3$, $C_{13}H_{18}O_2$, $C_{14}H_{20}O_2$, $C_{12}H_{14}O_3$, $C_{10}H_9O_2F_3$, $C_{10}H_{10}O_4$, $C_{12}H_{14}O_2$, $C_{14}H_{18}O_2$, $C_{13}H_{16}O_4$ or $C_{12}H_{16}O_2$.

In yet a further separate aspect of the present invention, the phosphor includes semiconductor nano-crystalline particles, metallic oxide particles and core-shell nano-crystals.

In yet a further separate aspect of the present invention, the phosphor includes compounds of $AgINS_2$ and $CuINS_2$ in groups I-VI; compounds of CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe in groups II-VI; compounds of GaN, GaP, GaAs, GaSb, AN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb in groups III-V; compounds of SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe and SnPbSTe in groups IV-VI; compounds of Si, Ge, SiC and SiGe in group IV.

In yet a further separate aspect of the present invention, the phosphor includes a compound having a perovskite structure ABX3, where A includes Cs, Rb, Na, K, other suitable alkali metals, combinations thereof or an alkyl amine having at most 5 carbon atoms; B includes Pb, Sn, Ge, Sb, Bi, other suitable metals or combinations thereof; X includes chloride, bromide, iodide, cyanide, thiocyanate, isothicyanate, sulfide or combinations thereof.

The manufacturing method of phosphorescent materials in accordance with an aspect of the present invention includes:

modifying a trimethoxysilylpropyl material with a polyethylenimine material in methylbenzene to obtain a trimethoxysilylpropyl-modified polyethylenimine material in a first solution;

heating the trimethoxysilylpropyl-modified polyethylenimine material of the first solution in a predetermined temperature;

dissolving an epoxy material in methylbenzene to obtain a second solution; and reacting the heated first solution with the second solution in a reactor by stirring to obtain a reactant;

wherein the reactant is a dispersion carrier for reacting with a phosphor or a quantum dot material to form a phosphorescent synthetic.

In a separate aspect of the present invention, the predetermined temperature ranges between 80 and 120 degrees centigrade.

In a further separate aspect of the present invention, the heated first solution and the second solution are supplied with a predetermined molar ratio ranging between 1:2 to 1:4.

In yet a further separate aspect of the present invention, the phosphorescent synthetic is further cooled and purified to obtain a colloid phosphor material.

Further scope of the applicability of the present invention will become apparent from the detailed description given hereinafter. However, it should be understood that the detailed description and specific examples, while indicating preferred embodiments of the invention, are given by way of illustration only, since various will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 6-1 and 6-2 are a set of chemical structure views of trimethoxysilylpropyl materials applied in a phosphor stabilizer in accordance with a preferred embodiment of the present invention.

FIGS. 7-1 to 7-50 are a set of chemical structure views of various epoxy materials applied in the phosphor stabilizer in accordance with the preferred embodiment of the present invention.

FIG. 8 is a flow chart of a manufacturing method of the phosphor stabilizer in accordance with a preferred embodiment of the present invention.

FIG. 9 is a chart illustrating wavelengths in relation to luminous intensities of a phosphor in accordance with a preferred embodiment of the present invention.

DETAILED DESCRIPTION OF THE INVENTION

It is noted that an enhanced light diffusion film structure in accordance with the preferred embodiment of the present invention can be applicable to various phosphor materials (or fluorescent materials) and devices thereof. The enhanced light diffusion film structure in accordance with the preferred embodiment of the present invention can be applicable to displays or other technical field, which are not limitative of the present invention.

Figure 1:
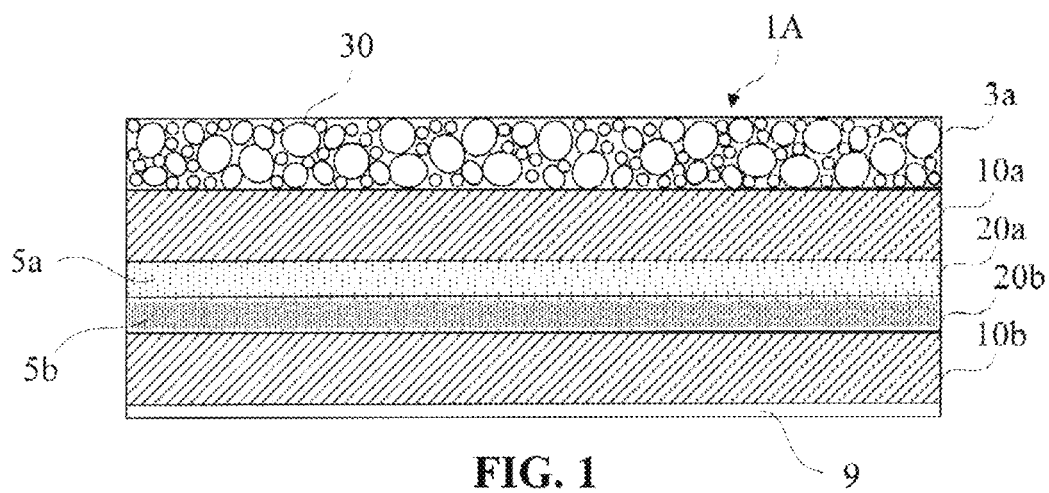
FIG. 1 is a schematic view of an enhanced light diffusion film structure in accordance with a first preferred embodiment of the present invention.

FIG. 1 shows a schematic view of an enhanced light diffusion film structure in accordance with a first preferred embodiment of the present invention. Referring now to FIG. 1, the enhanced light diffusion film structure 1A in accordance with the first preferred embodiment of the present invention includes a first substrate 10a, a second substrate 10b, a first light guide diffusion layer 20a, a second light guide diffusion layer 20b, a light diffusion particle layer 3a and a protective layer 9. The first substrate 10a has a first surface (as best shown at an upper side) and a second surface (as best shown at a lower side) while the second substrate 10b has a first surface (as best shown at an upper side) and a second surface (as best shown at a lower side).

With continued reference to FIG. 1, by way of example, the first light guide diffusion layer 20a has a first surface (as best shown at an upper side) and a second surface (as best shown at a lower side) while the second light guide diffusion layer 20b has a first surface (as best shown at an upper side) and a second surface (as best shown at a lower side). The first light guide diffusion layer 20a is provided on the second surface of the first substrate 10a while the second light guide diffusion layer 20b is provided on the first surface of the second substrate 10b.

With continued reference to FIG. 1, by way of example, the first light guide diffusion layer 20a includes a first light guide diffusion material 5a which has a first (relatively higher or lower) degree of light guide diffusion to guide and diffuse incident light exited by the second surface of the first substrate 10a to form first-stage guided and diffused light. Correspondingly, the second light guide diffusion layer 20b includes a second light guide diffusion material 5b which has a second (relatively lower or higher) degree of light guide diffusion to further guide and diffuse the first-stage guided and diffused light exited by the second surface of the first light guide diffusion layer 20a to form second-stage guided and diffused light. Preferably, the first degree of light guide diffusion of the first light guide diffusion material 5a of the first light guide diffusion layer 20a is relatively lower than the second degree of light guide diffusion of the second light guide diffusion material 5b of the second light guide diffusion layer 20b so as to enhance light diffusion effect and to reduce a total thickness of the first and second light guide diffusion layers 20a, 20b.

In a preferred embodiment, the first light guide diffusion material 5a and the second light guide diffusion material 5b contain a predetermined amount of phosphor materials or QD materials (i.e. dispersion carrier of phosphor or QD material). The phosphor materials or QD materials of first light guide diffusion material 5a to second light guide diffusion material 5b has a predetermined ratio A:B (e.g., 1:3 or 3:1).

With continued reference to FIG. 1, by way of example, the light diffusion particle layer 3a is provided on the first surface of the first substrate 10a for preliminary diffusion of incident light. The light diffusion particle layer 3a includes a plurality of light diffusion particles 30 deployed therein. The protective layer 9 is further attached to the second surface of the second surface 10b and is made from a degree of hardness materials so as to protect the second surface of the second surface 10b or the enhanced light diffusion film structure.

Figure 1A:
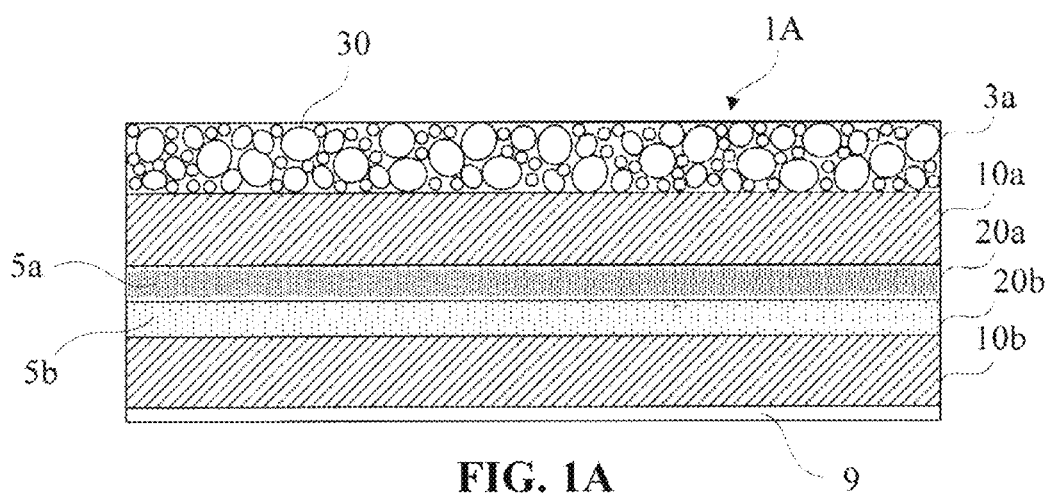
FIG. 1A is a schematic view of an enhanced light diffusion film structure in accordance with another preferred embodiment of the present invention.

FIG. 1A shows a schematic view of an enhanced light diffusion film structure in accordance with another preferred embodiment of the present invention. Referring to FIG. 1A, the enhanced light diffusion film structure 1A in accordance with the preferred embodiment of the present invention has the first degree of light guide diffusion of the first light guide diffusion material 5a of the first light guide diffusion layer 20a relatively higher than the second degree of light guide diffusion of the second light guide diffusion material 5b of the second light guide diffusion layer 20b so as to provide higher light diffusion effect and to reduce a total thickness of the first light guide diffusion layer 20a and the second light guide diffusion layer 20b.

Referring again to FIGS. 1 and 1A, in a preferred embodiment, the light diffusion particle layer 3a and the protective layer 9 of the enhanced light diffusion film structure 1A are made of same materials, similar materials or dissimilar materials, including hardness protection materials or light diffusion materials.

Figure 2:
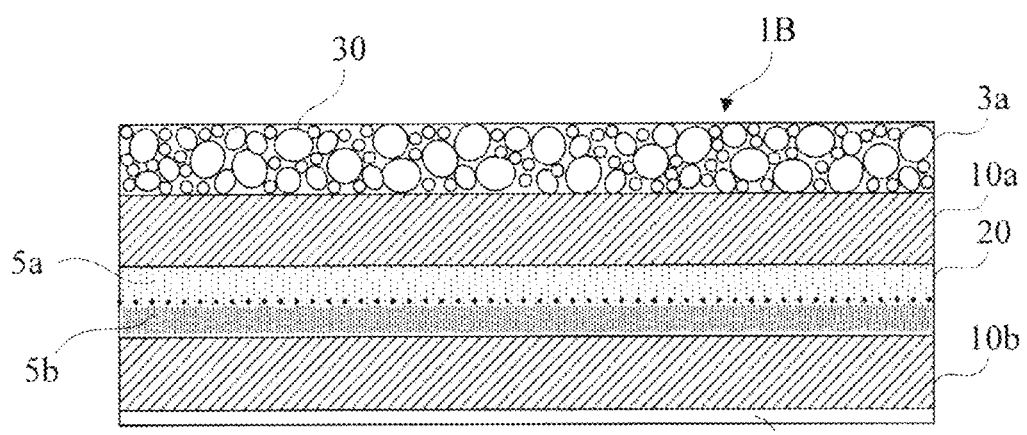
FIG. 2 is a schematic view of an enhanced light diffusion film structure in accordance with a second preferred embodiment of the present invention.

FIG. 2 shows a schematic view of an enhanced light diffusion film structure in accordance with a second preferred embodiment of the present invention. Referring to FIGS. 1, 1A and 2, in comparison with the first embodiment, the enhanced light diffusion film structure 1B in accordance with the second preferred embodiment of the present invention includes the first light guide diffusion layer 20a (as best shown in FIGS. 1 and 1A) and the second light guide diffusion layer 20b (as best shown in FIGS. 1 and 1A) combined to form a single light guide diffusion layer 20 to minimize a total thickness of the first and second light guide diffusion layers 20a, 20b between which existing a light guide diffusion transition layer (dotted line). However, the single light guide diffusion layer 20 has a various degree of light guide increasing or decreasing diffusion (lower-to-higher diffusion or higher-to-lower diffusion) to form two-stage guided and diffused light.

Figure 3:
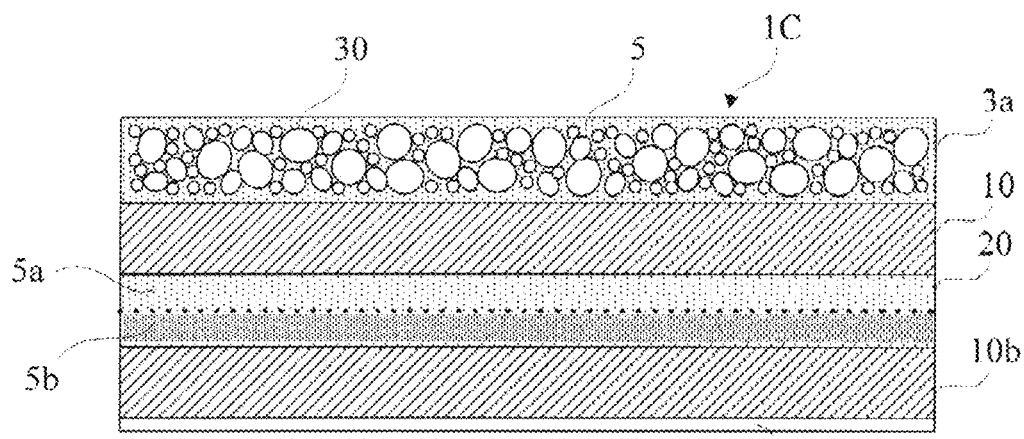
FIG. 3 is a schematic view of an enhanced light diffusion film structure in accordance with a third preferred embodiment of the present invention.
Figure 4:
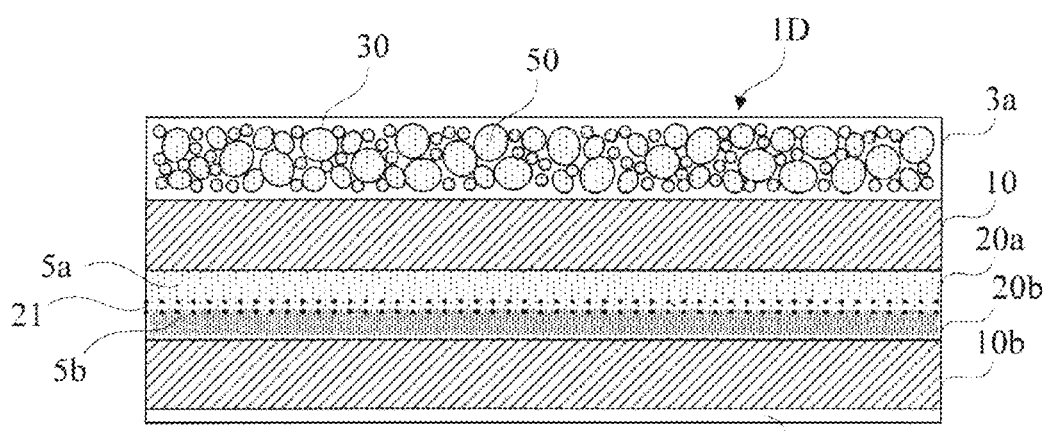
FIG. 4 is a schematic view of an enhanced light diffusion film structure in accordance with a fourth preferred embodiment of the present invention.

FIG. 3 shows a schematic view of an enhanced light diffusion film structure in accordance with a third preferred embodiment of the present invention. Referring to FIGS. 1, 1A and 3, in comparison with the first embodiment, the enhanced light diffusion film structure 1C in accordance with the third preferred embodiment of the present invention includes the first surface of the first substrate 10a provided with a light diffusion particle layer 3a, including a plurality of light diffusion particles 30, with the light diffusion particle layer made of a third light guide diffusion material 5. FIG. 4 shows a schematic view of an enhanced light diffusion film structure in accordance with a fourth preferred embodiment of the present invention. Referring to FIGS. 2 and 4, in comparison with the second embodiment, the enhanced light diffusion film structure 1D in accordance with the fourth preferred embodiment of the present invention includes a thin light guide diffusion layer 21 (dotted lines) further provided between the first light guide diffusion layer 20a and the second light guide diffusion layer 20b to form multiple light guide diffusion layers having a various degree of light guide diffusion to form multi-stage guided and diffused light. Further, the light diffusion particles 30 are made of a fourth light guide diffusion material 50 for enhancing preliminary diffusion of incident light.

Figure 5:
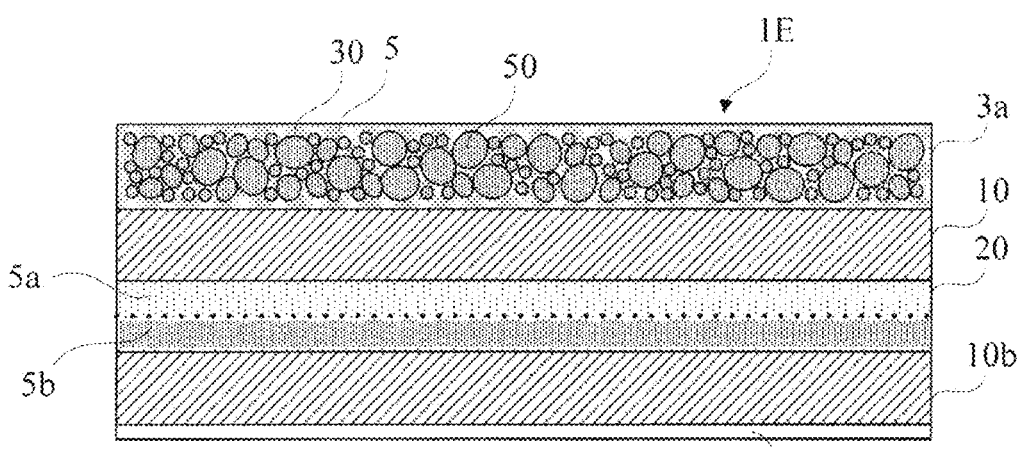
FIG. 5 is a schematic view of an enhanced light diffusion film structure in accordance with a fifth preferred embodiment of the present invention.

FIG. 5 shows a schematic view of an enhanced light diffusion film structure in accordance with a fifth preferred embodiment of the present invention. Referring to FIGS. 3, 4 and 5, in comparison with the third and fourth embodiments, the enhanced light diffusion film structure 1E in accordance with the fifth preferred embodiment of the present invention includes the light diffusion particle layer 3a made of a third light guide diffusion material 5 and the a plurality of light diffusion particles 30 made of a fourth light guide diffusion material 50. In a preferred embodiment, a third degree of light guide diffusion of the third light guide diffusion material 5 is relatively lower than a fourth degree of light guide diffusion of the fourth light guide diffusion material 50.

In a preferred embodiment, the third light guide diffusion material 5 and the fourth light guide diffusion material 50 also contain a predetermined amount of phosphor materials or QD materials (i.e. dispersion carrier of phosphor or QD material). The phosphor materials or QD materials of third light guide diffusion material 5 to the fourth light guide diffusion material 50 has a predetermined ratio A1:B1 (e.g., 1:3 or 3:1).

As is described in greater detail below, a phosphor stabilizer and manufacturing method thereof in accordance with the preferred embodiment of the present invention can be applicable to various phosphor materials (or fluorescent materials) and devices thereof. The phosphor stabilizer in accordance with the preferred embodiment of the present invention can be used as a stabilizer, an absorbent or a dispersion carrier for phosphors or are applicable to phosphorescent materials, displays, optoelectronics, biomedical engineering or other technical field, which are not limitative of the present invention.

By way of example, the phosphor stabilizer includes at least one trimethoxysilylpropyl-modified polyethylenimine material and at least one epoxy material. The trimethoxysilylpropyl-modified polyethylenimine material is provided with a first predetermined amount while the epoxy material is provided with a second predetermined amount. In combination reaction, the first predetermined amount of the trimethoxysilylpropyl-modified polyethylenimine material reacts with the second predetermined amount of the epoxy material to form a reactant. The reactant is used as a dispersion carrier which can further react with a phosphor or a QD material for enhancing a degree of luminous stability and thermal stability thereof.

Furthermore, the phosphor stabilizer of the present invention can be used as a stabilizer or an absorbent to stabilize the phosphor or the QD material, or as a surface stabilizer to coat or to displace a surface of the phosphor or the QD material. By way of example, the phosphor includes compounds of $AgINS_2$ and $CuINS_2$ in groups I-VI; compounds of CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe in groups II-VI; compounds of GaN, GaP, GaAs, GaSb, AN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb in groups III-V; compounds of SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe and SnPbSTe in groups IV-VI; compounds of Si, Ge, SiC and SiGe in group IV.

Figures 1, 6:
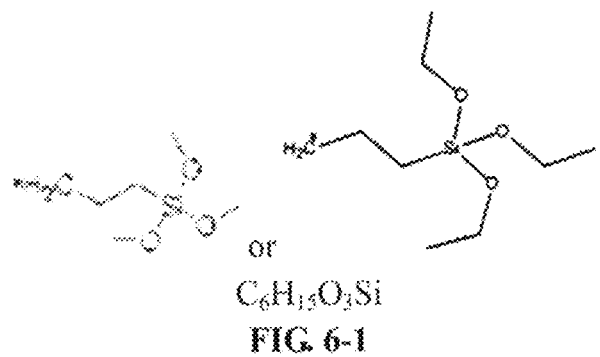
Figures 2, 6:
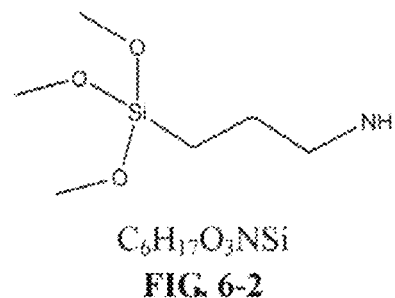

FIGS. 6-1 and 6-2 show a set of chemical structure views of the trimethoxysilylpropyl materials suitably applied in the phosphor stabilizer in accordance with a preferred embodiment of the present invention. Referring now to FIGS. 6-1 and 6-2, the phosphor stabilizer in accordance with the preferred embodiment of the present invention can utilize the trimethoxysilylpropyl-modified polyethylenimine material having a functional group for modifying and bonding polyethylenimine is a free radical of the trimethoxysilylpropyl material. For example, the trimethoxysilylpropyl material can be selected from $C_6H_{15}O_3Si$ (as shown in FIG. 6-1) or $C_6H_{17}O_3NSi$ (as shown in FIG. 6-2).

Figures 1, 7:
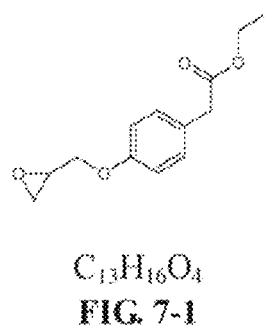
Figures 2, 7:
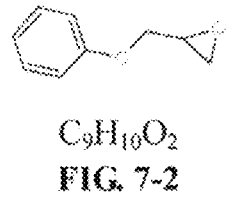
Figures 3, 7:
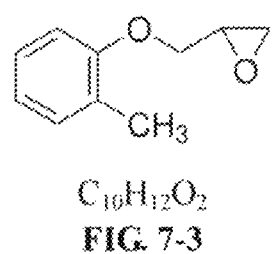
Figures 4, 7:
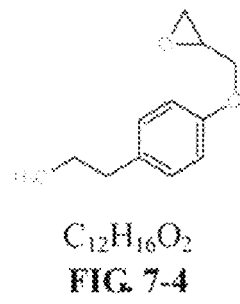
Figures 5, 7:
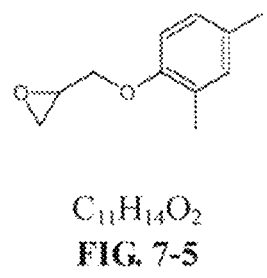
Figures 6, 7:
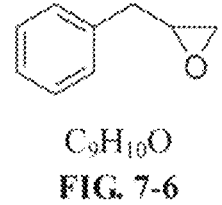
Figure 7:
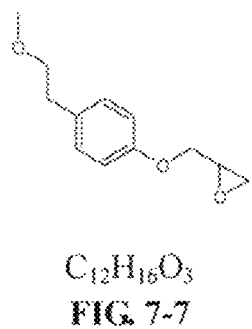

FIGS. 7-1 to 7-50 show a set of chemical structure views of various epoxy materials suitably applied in the phosphor stabilizer in accordance with the preferred embodiment of the present invention. Referring to FIGS. 7-1 to 7-50, the phosphor stabilizer in accordance with the preferred embodiment of the present invention can utilize the epoxy materials for reacting with the trimethoxysilylpropyl-modified polyethylenimine material. By way of example, the epoxy material can be selected from $C_{13}H_{16}O_4$ (as shown in FIG. 7-1), $C_9H_{10}O_2$ (as shown in FIG. 7-2), $C_{10}H_{12}O_2$ (as shown in FIG. 7-3), $C_{12}H_{16}O_2$ (as shown in FIG. 7-4), $C_{11}H_{14}O_2$ (as shown in FIG. 7-5), $C_9H_{10}O$ (as shown in FIG. 7-6), $C_{12}H_{16}O_3$ (as shown in FIG. 7-7), $C_{12}H_{14}O_4$ (as shown in FIG. 7-8), $C_{10}H_{12}O_3$ (as shown in FIGS. 7-9 and 7-10), $C_{18}H_{28}O_2$ (as shown in FIG. 7-11), $C_{11}H_{14}O_3$ (as shown in FIG. 7-12), $C_9H_{10}O$ (as shown in FIG. 7-13), $C_{11}H_{12}O_3$ (as shown in FIG. 7-14), $C_9H_9O_2F$ (as shown in FIG. 7-15), $C_{10}H_{12}O_2$ (as shown in FIG. 7-16), $C_{15}H_{14}O_2$ (as shown in FIG. 7-17), $C_{11}H_{14}O_3$ (as shown in FIG. 7-18), $C_9H_{10}O_2$ (as shown in FIG. 7-19), $C_{14}H_{16}O_3N_2$ (as shown in FIG. 7-20), $C_{12}H_{14}O_3$ (as shown in FIG. 7-21), $C_9H_9O_3N$ (as shown in FIG. 7-22), $C_{18}H_{18}O_3$ (as shown in FIG. 7-23), $C_{15}H_{13}O_2N$ (as shown in FIG. 7-24), $C_{13}H_{12}O_2$ (as shown in FIG. 7-25), $C_{19}H_{38}O_2$ (as shown in FIG. 7-26), $C_{11}H_{22}O_2$ (as shown in FIG. 7-27), $C_{13}H_{26}O_2$ (as shown in FIG. 7-27), $C_{15}H_{30}O_2$ (as shown in FIG. 7-28), $C_{17}H_{34}O_2$ (as shown in FIG. 7-28), $C_{12}H_8O_2F_{16}$ (as shown in FIG. 7-29), $C_8H_8O_2F_8$ (as shown in FIG. 7-30), $C_5H_6O_2F_4$ (as shown in FIG. 7-31), $C_{11}H_5OF_{17}$ (as shown in FIG. 7-32), $C_9H_5OF_{13}$ (as shown in FIG. 7-33), $C_{11}H_{14}O_4$ (as shown in FIG. 7-34), $C_{11}H_{13}O_3N$ (as shown in FIG. 7-35), $C_{12}H_{14}O_3$ (as shown in FIG. 7-36), $C_{13}H_{18}O_2$ (as shown in FIGS. 7-37 and 7-38), $C_{14}H_{20}O_2$ (as shown in FIG. 7-39), $C_{11}H_{14}O_3$ (as shown in FIG. 7-40), $C_{12}H_{14}O_3$ (as shown in FIG. 7-41), $C_{13}H_{18}O_2$ (as shown in FIGS. 7-42 and 7-43), $C_{10}H_9O_2F_3$ (as shown in FIG. 7-44), $C_{10}H_{10}O_4$ (as shown in FIG. 7-45), $C_{12}H_{14}O_2$ (as shown in FIG. 7-46), $C_{14}H_{18}O_2$ (as shown in FIG. 7-47), $C_{13}H_{16}O_4$ (as shown in FIG. 7-48), $C_{11}H_{14}O_2$ (as shown in FIG. 7-49) or $C_{12}H_{16}O_2$ (as shown in FIG. 7-50).

Figures 7, 8:
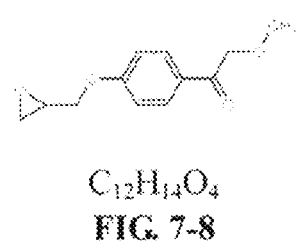

FIG. 8 shows a flow chart of a manufacturing method of the phosphor stabilizer in accordance with a first preferred embodiment of the present invention. Referring to FIGS. 6-1 and 8, the manufacturing method of the phosphor stabilizer of the first preferred embodiment of the present invention includes the step S1: modifying the trimethoxysilylpropyl material with the polyethylenimine material in methylbenzene to obtain the trimethoxysilylpropyl-modified polyethylenimine material in a first solution and repeating the step if necessary. By way of example, a predetermined amount (e.g., 62 grams) of the polyethylenimine material is dissolved in the methylbenzene and is modified by the trimethoxysilylpropyl material, as shown in FIG. 6-1, to form the first solution which contains the trimethoxysilylpropyl-modified polyethylenimine material (CAS: 136856-91-2).

Referring again to FIG. 8, the manufacturing method of the phosphor stabilizer of the first preferred embodiment of the present invention includes the step S2: heating the trimethoxysilylpropyl-modified polyethylenimine material of the first solution in a predetermined temperature. By way of example, the predetermined temperature ranges between 80 and 120 degrees centigrade. In combination reaction, the heated first solution is supplied with a predetermined flow rate to a bottom or other suitable portion of a nitrogen filled reactor.

Referring again to FIGS. 6-1 and 8, the manufacturing method of the phosphor stabilizer of the first preferred embodiment of the present invention includes the step S3: dissolving the epoxy material in the methylbenzene to obtain a second solution. By way of example, a predetermined amount (e.g., 92 grams) of epoxy material $C_{13}H_{16}O_4$ (ethyl 2-[4-(oxiran-2-ylmethoxy)phenyl]acetate, CAS: 136856-91-2), as shown in FIG. 7-1, is dissolved in the methylbenzene to form the second solution which is supplied to a buffer device or the like.

Referring back to FIG. 8, the manufacturing method of the phosphor stabilizer of the first preferred embodiment of the present invention includes the step S4: reacting the heated first solution with the second solution in the nitrogen filled reactor by stirring to obtain a first reactant. By way of example, the heated first solution and the second solution are supplied with a predetermined molar ratio ranging between 1:2 to 1:4. The first reactant can be used as a dispersion carrier for reacting with the phosphors or the QD materials (e.g., 16 grams) to form a first phosphorescent synthetic which is further cooled and purified to obtain a colloid phosphor material. The first phosphorescent synthetic has a functional group to combine with the phosphor for enhancing a degree of luminous stability and thermal stability thereof. In a preferred embodiment, the manufacturing method of the phosphor stabilizer of the present invention can utilize other trimethoxysilylpropyl material and polyethylenimine material (e.g., $C_6H_{15}O_3Si$).

Figure 8:
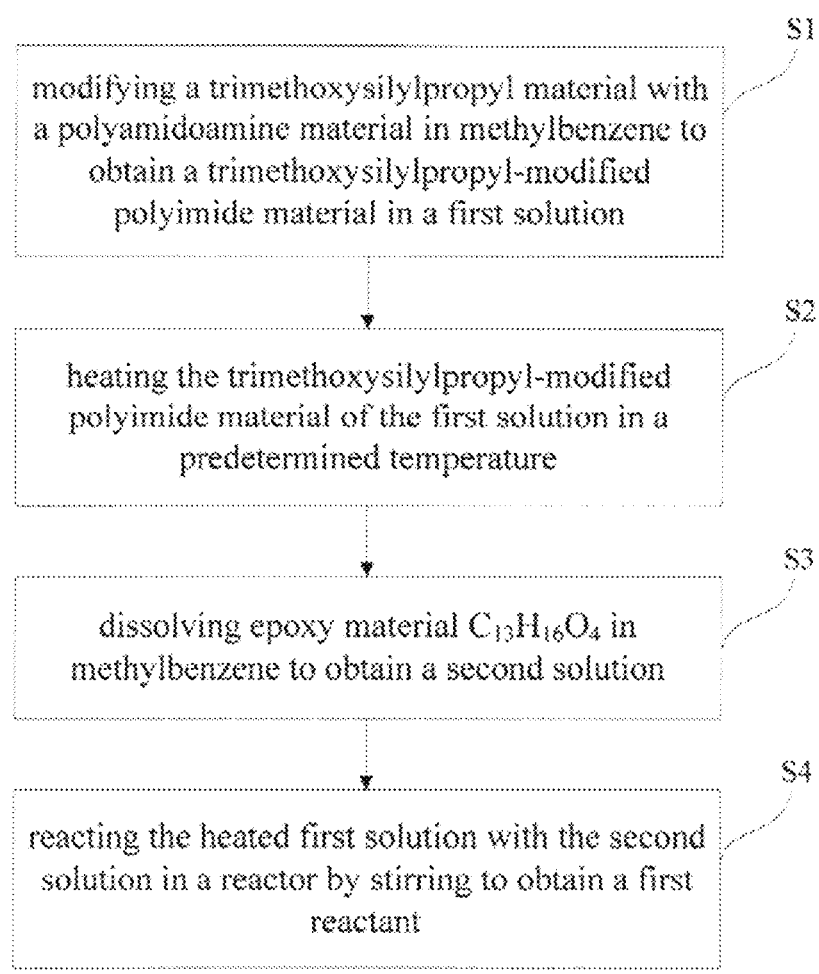
Figure 8A:
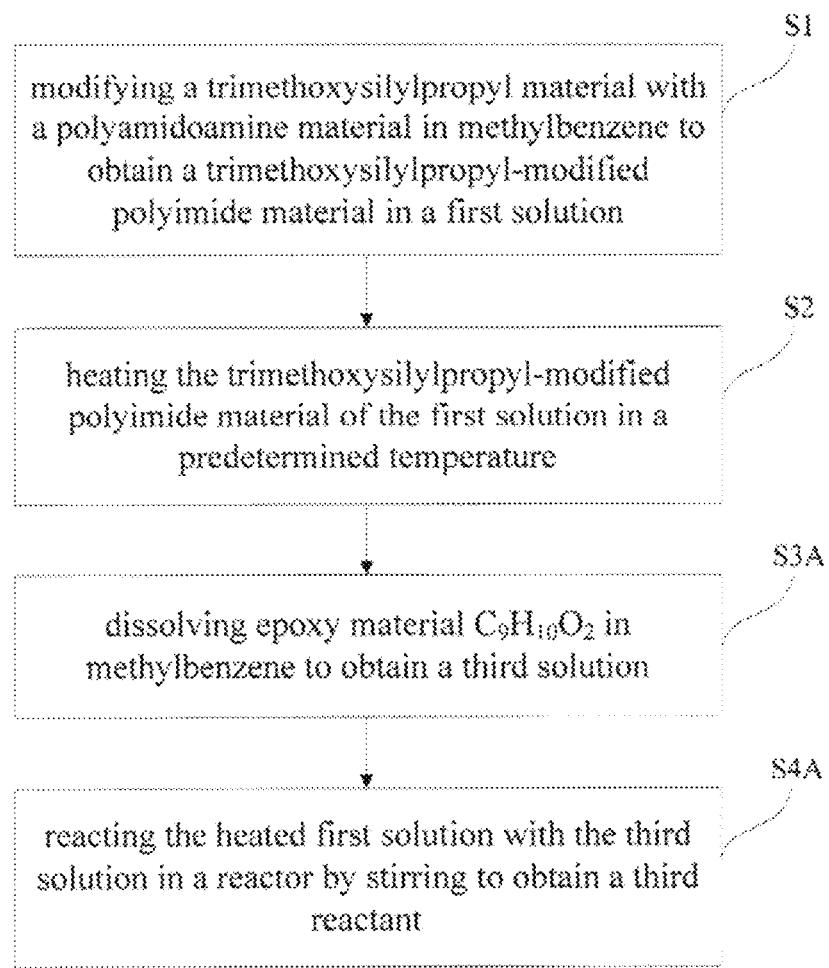
FIG. 8A is a flow chart of a manufacturing method of the phosphor stabilizer in accordance with another preferred embodiment of the present invention.
Figure 9:
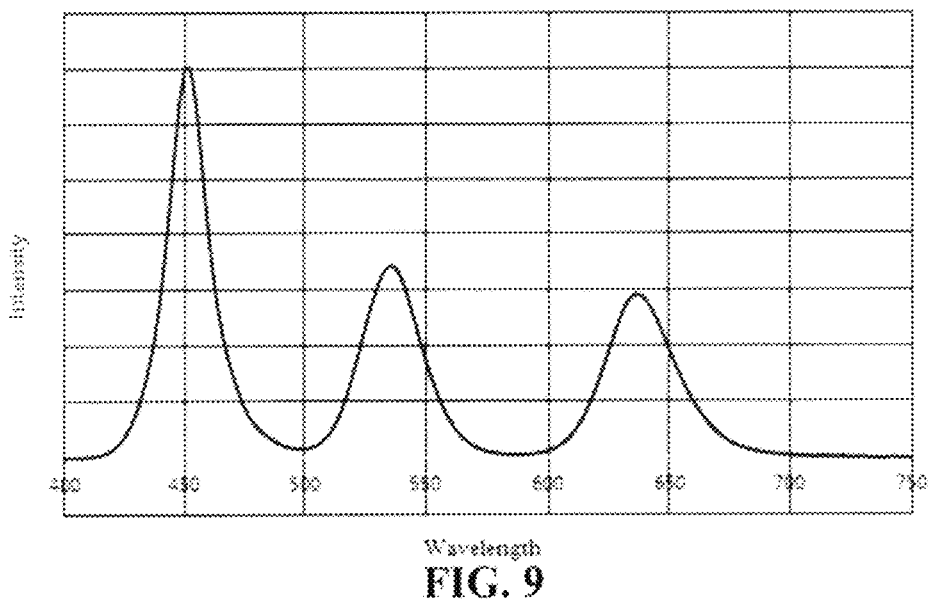

FIG. 8A shows a flow chart of a manufacturing method of the phosphor stabilizer in accordance with another preferred embodiment of the present invention. Referring to FIGS. 6-1 and 8A, the manufacturing method of the phosphor stabilizer of the preferred embodiment of the present invention includes the steps S1 and S2 identical with those of the first preferred embodiment, as shown in FIG. 8, and the detailed description will be omitted.

Turning now to FIGS. 7-2 and 8A, the manufacturing method of the phosphor stabilizer of the preferred embodiment of the present invention includes the step S3A: by way of example, dissolving a predetermined amount (e.g., 32 grams) of epoxy material $C_9H_{10}O_2$, as shown in FIG. 7-2, in the methylbenzene to form a third solution which is supplied to a buffer device or the like.

Referring back to FIG. 8A, the manufacturing method of the phosphor stabilizer of the preferred embodiment of the present invention includes the step S4A: reacting the heated first solution with the third solution in the nitrogen filled reactor by stirring to obtain a second reactant. By way of example, the heated first solution and the third solution are supplied with a predetermined molar ratio ranging between 1:2 to 1:4. The second reactant can be also used as a dispersion carrier for reacting with the phosphors or the QD materials (e.g., 16 grams) to form a second phosphorescent synthetic which is further cooled and purified to obtain a colloid phosphor material.

Figures 7, 8, 9:
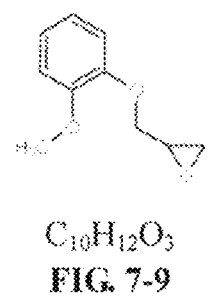
Figures 7, 8, 9, 10:
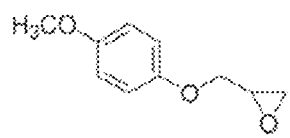
Figures 7, 8, 9, 10, 11:
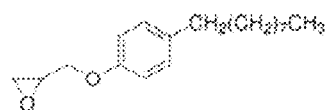
Figures 7, 8, 9, 10, 11, 12:
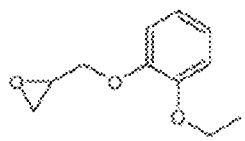
Figures 7, 8, 9, 10, 11, 12, 13:
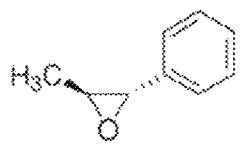
Figures 7, 8, 9, 10, 11, 12, 13, 14:
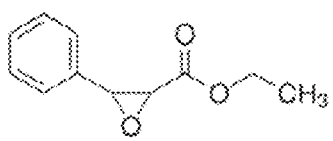
Figures 7, 8, 9, 10, 11, 12, 13, 14, 15:
Figures 7, 8, 9, 10, 11, 12, 13, 14, 15, 16:
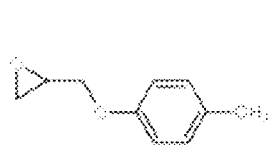
Figures 7, 8, 9, 10, 11, 12, 13, 14, 15, 16, 17:
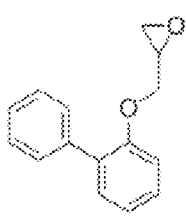
Figures 7, 8, 9, 10, 11, 12, 13, 14, 15, 16, 17, 18:
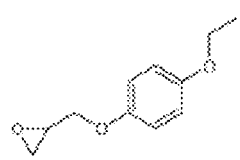
Figures 7, 8, 9, 10, 11, 12, 13, 14, 15, 16, 17, 18, 19:
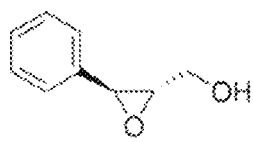
Figures 7, 8, 9, 10, 11, 12, 13, 14, 15, 16, 17, 18, 19, 20:
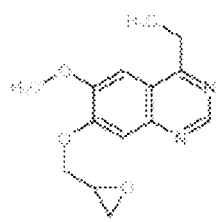
Figures 7, 8, 9, 10, 11, 12, 13, 14, 15, 16, 17, 18, 19, 20, 21:
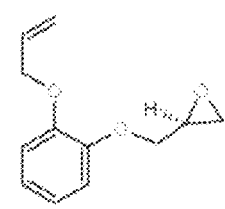
Figures 7, 8, 9, 10, 11, 12, 13, 14, 15, 16, 17, 18, 19, 20, 21, 22:
Figures 7, 8, 9, 10, 11, 12, 13, 14, 15, 16, 17, 18, 19, 20, 21, 22, 23:
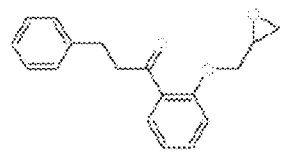
Figures 7, 8, 9, 10, 11, 12, 13, 14, 15, 16, 17, 18, 19, 20, 21, 22, 23, 24:
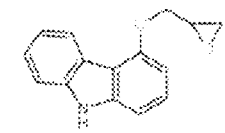
Figures 7, 8, 9, 10, 11, 12, 13, 14, 15, 16, 17, 18, 19, 20, 21, 22, 23, 24, 25:
Figures 7, 8, 9, 10, 11, 12, 13, 14, 15, 16, 17, 18, 19, 20, 21, 22, 23, 24, 25, 26:
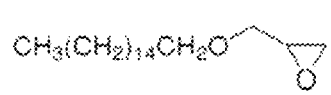
Figures 7, 8, 9, 10, 11, 12, 13, 14, 15, 16, 17, 18, 19, 20, 21, 22, 23, 24, 25, 26, 27:
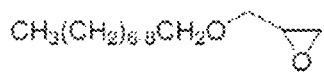
Figures 7, 8, 9, 10, 11, 12, 13, 14, 15, 16, 17, 18, 19, 20, 21, 22, 23, 24, 25, 26, 27, 28:
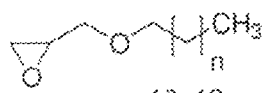
Figures 7, 8, 9, 10, 11, 12, 13, 14, 15, 16, 17, 18, 19, 20, 21, 22, 23, 24, 25, 26, 27, 28, 29:
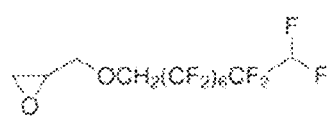
Figures 7, 8, 9, 10, 11, 12, 13, 14, 15, 16, 17, 18, 19, 20, 21, 22, 23, 24, 25, 26, 27, 28, 29, 30:
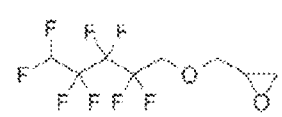
Figures 7, 8, 9, 10, 11, 12, 13, 14, 15, 16, 17, 18, 19, 20, 21, 22, 23, 24, 25, 26, 27, 28, 29, 30, 31:
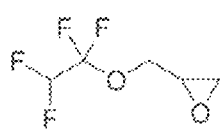
Figures 7, 8, 9, 10, 11, 12, 13, 14, 15, 16, 17, 18, 19, 20, 21, 22, 23, 24, 25, 26, 27, 28, 29, 30, 31, 32:
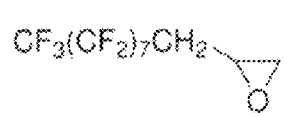
Figures 7, 8, 9, 10, 11, 12, 13, 14, 15, 16, 17, 18, 19, 20, 21, 22, 23, 24, 25, 26, 27, 28, 29, 30, 31, 32, 33:
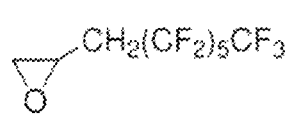
Figures 7, 8, 9, 10, 11, 12, 13, 14, 15, 16, 17, 18, 19, 20, 21, 22, 23, 24, 25, 26, 27, 28, 29, 30, 31, 32, 33, 34:
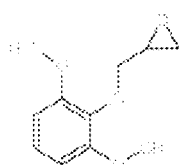
Figures 7, 8, 9, 10, 11, 12, 13, 14, 15, 16, 17, 18, 19, 20, 21, 22, 23, 24, 25, 26, 27, 28, 29, 30, 31, 32, 33, 34, 35:
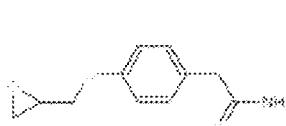
Figures 7, 8, 9, 10, 11, 12, 13, 14, 15, 16, 17, 18, 19, 20, 21, 22, 23, 24, 25, 26, 27, 28, 29, 30, 31, 32, 33, 34, 35, 36:
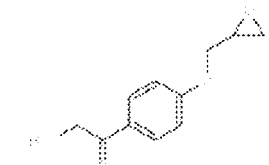
Figures 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37:
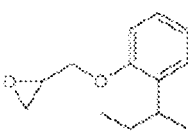
Figures 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38:
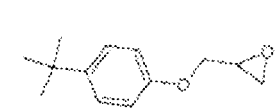
Figures 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39:
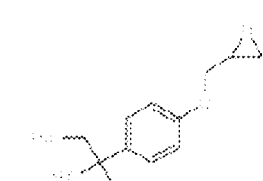
Figures 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40:
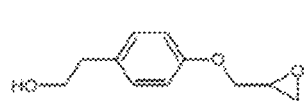
Figures 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41:
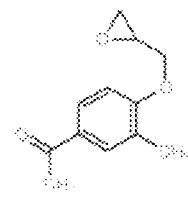
Figures 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42:
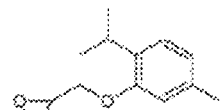
Figures 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43:
Figures 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44:
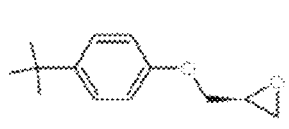
Figures 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45:
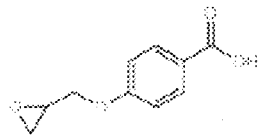
Figures 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46:
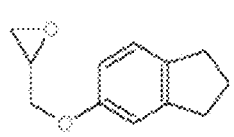
Figures 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47:
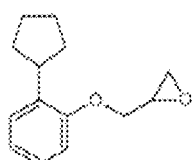
Figures 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48:
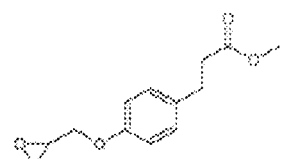
Figures 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49:
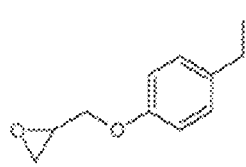
Figures 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50:
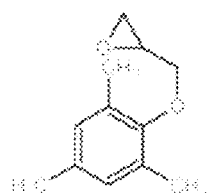

FIG. 9 shows a chart illustrating wavelengths in relation to luminous intensities of a phosphor in accordance with a preferred embodiment of the present invention, including three peaks. Referring to FIG. 9, by way of example, the second reactant is formed from trimethoxysilylpropyl material $C_6H_{15}O_3Si$ reacting with polyethylenimine material $C_9H_{10}O_2$ and reacts with the phosphor to form a phosphorescent synthetic such as a blue-excited phosphor. The phosphorescent synthetic is a blue (468 nm) excited phosphor, as best shown in an arrow at left portion in FIG. 9, including a green (520 nm-580 nm) QD material, as best shown in an arrow at middle portion in FIG. 9, and a red (570 nm-660 nm) QD material, as best shown in an arrow at right portion in FIG. 9. Advantageously, the phosphorescent synthetic has a high degree of luminous stability and thermal stability and can be used as a surface stabilizer (agent) to coat or to displace a surface of the phosphor or the QD material.

Advantageously, the manufacturing method of the phosphor stabilizer of the present invention is obviously rapid, clean, high efficient, economic, easy-to-process, simplifies in purification, lowers byproduct, enhances luminous efficiency of the phosphorescent material, lowers the occurrence of shrinkage of products, and is suitable for mass production.

Although the invention has been described in detail with reference to its presently preferred embodiment, it will be understood by one of ordinary skills in the art that various modifications can be made without departing from the spirit and the scope of the invention, as set forth in the appended claims.

What is claimed is:

1. An enhanced light diffusion film structure comprising:
    a first substrate having a first surface and a second surface;
    a first light guide diffusion layer having a first surface and a second surface and provided on the second surface of the first substrate, with the first light guide diffusion layer including a first light guide diffusion material, with the first light guide diffusion material having a first degree of light guide diffusion to guide and diffuse incident light exited by the second surface of the first substrate to form first-stage guided and diffused light;
    a second substrate having a first surface and a second surface; and
    a second light guide diffusion layer having a first surface and a second surface and provided on the first surface of the second substrate, with the second light guide diffusion layer including a second light guide diffusion material, with the second light guide diffusion material having a second degree of light guide diffusion to further guide and diffuse the first-stage guided and diffused light exited by the second surface of the first light guide diffusion layer to form second-stage guided and diffused light;
    wherein the first degree of light guide diffusion of the first light guide diffusion material of the first light guide diffusion layer made of a first QD material or first phosphors is relatively higher than the second degree of light guide diffusion of the second light guide diffusion material of the second light guide diffusion layer made of a second QD material or second phosphors so as to enhance light diffusion effect and to reduce a total thickness of the first and second light guide diffusion layers.

2. The structure as defined in claim 1, wherein the first light guide diffusion layer and the second light guide diffusion layer are combined to form a single light guide diffusion layer having a various degree of light guide decreasing diffusion to form two-stage guided and diffused light.

3. The structure as defined in claim 1, wherein the first surface of the first substrate is provided with a light diffusion particle layer, including a plurality of light diffusion particles.

4. The structure as defined in claim 1, wherein the first surface of the first substrate is provided with a light diffusion particle layer, including a plurality of light diffusion particles, with the light diffusion particle layer is made of a third light guide diffusion material.

5. The structure as defined in claim 1, wherein the first surface of the first substrate is provided with a light diffusion particle layer, including a plurality of light diffusion particles made of a fourth light guide diffusion material.

6. The structure as defined in claim 1, wherein the first surface of the first substrate is provided with a light diffusion particle layer, including a plurality of light diffusion particles, with the light diffusion particle layer is made of a third light guide diffusion material, with the a plurality of light diffusion particles is made of a fourth light guide diffusion material.

7. The structure as defined in claim 6, wherein a third degree of light guide diffusion of the third light guide diffusion material is relatively lower than a fourth degree of light guide diffusion of the fourth light guide diffusion material.

8. The structure as defined in claim 1, wherein a thin light guide diffusion layer is further provided between the first light guide diffusion layer and the second light guide diffusion layer to form multiple light guide diffusion layers having a various degree of light guide diffusion to form multi-stage guided and diffused light.

9. The structure as defined in claim 1, wherein a protective layer is attached to the second surface of the second surface.

10. The structure as defined in claim 1, wherein the first phosphors or the second phosphors include a compound having a perovskite structure ABX3, where A includes Cs, Rb, Na, K, combinations thereof or an alkyl amine having at most 5 carbon atoms; B includes Pb, Sn, Ge, Sb, Bi or combinations thereof; X includes chloride, bromide, iodide, cyanide, thiocyanate, isothicyanate, sulfide or combinations thereof.

11. An enhanced light diffusion film structure comprising:
a first substrate having a first surface and a second surface;
a first light guide diffusion layer having a first surface and a second surface and provided on the second surface of the first substrate, with the first light guide diffusion layer including a first light guide diffusion material, with the first light guide diffusion material having a first degree of light guide diffusion to guide and diffuse incident light exited by the second surface of the first substrate to form first-stage guided and diffused light;
a second substrate having a first surface and a second surface; and
a second light guide diffusion layer having a first surface and a second surface and provided on the first surface of the second substrate, with the second light guide diffusion layer including a second light guide diffusion material, with the second light guide diffusion material having a second degree of light guide diffusion to further guide and diffuse the first-stage guided and diffused light exited by the second surface of the first light guide diffusion layer to form second-stage guided and diffused light;
wherein the first degree of light guide diffusion of the first light guide diffusion material of the first light guide diffusion layer made of a first QD material or first phosphors is relatively lower than the second degree of light guide diffusion of the second light guide diffusion material of the second light guide diffusion layer made of a second QD material or second phosphors so as to enhance light diffusion effect and to reduce a total thickness of the first and second light guide diffusion layers.

12. The structure as defined in claim 11, wherein the first light guide diffusion layer and the second light guide diffusion layer are combined to form a single light guide diffusion layer having a various degree of light guide increasing diffusion to form two-stage guided and diffused light.

13. The structure as defined in claim 11, wherein the first surface of the first substrate is provided with a light diffusion particle layer, including a plurality of light diffusion particles.

14. The structure as defined in claim 11, wherein the first surface of the first substrate is provided with a light diffusion particle layer, including a plurality of light diffusion particles, with the light diffusion particle layer is made of a third light guide diffusion material.

15. The structure as defined in claim 11, wherein the first surface of the first substrate is provided with a light diffusion particle layer, including a plurality of light diffusion particles made of a fourth light guide diffusion material.

16. The structure as defined in claim 11, wherein the first surface of the first substrate is provided with a light diffusion particle layer, including a plurality of light diffusion particles, with the light diffusion particle layer is made of a third light guide diffusion material, with the a plurality of light diffusion particles is made of a fourth light guide diffusion material.

17. The structure as defined in claim 16, wherein a third degree of light guide diffusion of the third light guide diffusion material is relatively lower than a fourth degree of light guide diffusion of the fourth light guide diffusion material.

18. The structure as defined in claim 11, wherein a thin light guide diffusion layer is further provided between the first light guide diffusion layer and the second light guide diffusion layer to form multiple light guide diffusion layers having a various degree of light guide diffusion to form multi-stage guided and diffused light.

19. The structure as defined in claim 11, wherein a protective layer is attached to the second surface of the second surface.

20. The structure as defined in claim 11, wherein first phosphors or the second phosphors include a compound having a perovskite structure ABX3, where A includes Cs, Rb, Na, K, combinations thereof or an alkyl amine having at most 5 carbon atoms; B includes Pb, Sn, Ge, Sb, Bi or combinations thereof; X includes chloride, bromide, iodide, cyanide, thiocyanate, isothicyanate, sulfide or combinations thereof.

* * * * *